US008208083B2

(12) United States Patent
Yoon et al.

(10) Patent No.: US 8,208,083 B2
(45) Date of Patent: Jun. 26, 2012

(54) MOTHER SUBSTRATE FOR USE IN PRODUCTION OF A LIQUID CRYSTAL DISPLAY PANEL, MANUFACTURING METHOD THEREOF AND DISPLAY PANEL

(75) Inventors: Young-Soo Yoon, Suwon-si (KR); Joon-Chul Goh, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 602 days.

(21) Appl. No.: 12/366,393

(22) Filed: Feb. 5, 2009

(65) Prior Publication Data

US 2009/0296011 A1 Dec. 3, 2009

(30) Foreign Application Priority Data

May 30, 2008 (KR) .................. 10-2008-0050993

(51) Int. Cl.
*G02F 1/1333* (2006.01)
*G02F 1/1345* (2006.01)
(52) U.S. Cl. ............ 349/40; 349/59; 349/151; 349/158; 257/365; 257/701
(58) Field of Classification Search .................... 349/40; 257/365, 701
See application file for complete search history.

(56) References Cited

U.S. PATENT DOCUMENTS

| 4,128,448 | A  | * | 12/1978 | Bitterice et al. | .............. | 156/166 |
| 5,412,495 | A  | * | 5/1995  | Kim              | ................. | 349/40  |
| 6,207,997 | B1 | * | 3/2001  | Jeong et al.     | ................... | 257/365 |
| 7,242,087 | B2 | * | 7/2007  | Nakano et al.    | ................. | 257/701 |
| 7,372,514 | B2 | * | 5/2008  | Matsumoto et al. | ............ | 349/55  |
| 7,489,366 | B2 | * | 2/2009  | Liu et al.       | ......................... | 349/40  |

* cited by examiner

*Primary Examiner* — Huyen Ngo
(74) *Attorney, Agent, or Firm* — Innovation Counsel LLP

(57) ABSTRACT

A mother substrate for a liquid crystal display panel includes a plurality of antistatic circuits connected with driving signal lines, respectively, and a plurality of switching circuits interposed between adjacent antistatic circuits of the antistatic circuits, respectively. Each switching circuit is controllable to electrically interconnect the adjacent antistatic circuits to one another when an inspection of a post-production available area is performed, and to electrically isolate the adjacent antistatic circuits from one another when a normal operation of the post-production available area is performed.

18 Claims, 5 Drawing Sheets

MOTHER SUBSTRATE FOR USE IN PRODUCTION OF A LIQUID CRYSTAL DISPLAY PANEL, MANUFACTURING METHOD THEREOF AND DISPLAY PANEL

CROSS-REFERENCE TO RELATED APPLICATION

This application relies for priority upon Korean Patent Application No. 2008-50993 filed on May 30, 2008, the contents of which are herein incorporated by reference in their entirety.

BACKGROUND

1. Field of Invention

The present disclosure of invention relates to a mother substrate used for production and testing of a liquid crystal display panel and a method of manufacturing the same. More particularly, the present disclosure relates to a mother substrate having antistatic circuits and used for production of one or more liquid crystal display panels and a method of manufacturing and using the mother substrate.

2. Description of Related Technology

A liquid crystal display (LCD) panel typically includes a TFT array supporting substrate, a color filters supporting substrate that faces and is spaced apart from the TFT array substrate, and a liquid crystal layer formed between the TFT array substrate and the color filters substrate. The TFT array substrate typically includes a display area in which an image is displayed in response to various driving signals, and a peripheral area that surrounds the display area. A plurality of data lines and a plurality of scan lines are provided crossing over the display area. A plurality of pixel display units, which are electrically connected with the data and scan lines, are also arranged in the display area typically in a matrix format.

During mass production, one or more such liquid crystal display panels are often integrally manufactured as part of a monolithic and larger transparent substrate (hereinafter, referred to as a mother substrate). The mother substrate is later cut to create the corresponding one or more individual display panels during the mass production process. Production may including lithographic definition of many fine electrical conductors whose continuity or separation from one another may need to be verified during production.

Before cutting the mother substrate, an inspection process is carried out of inspecting the electric operation of various lines disposed on the mother substrate. One part of the inspection process calls for applying one or more test signals to the data lines and to the scan lines. However, during the inspection process, high voltage static electricity caused by friction may be present on the mother substrate, and the devices and lines provided on the liquid crystal panel(s) of the mother substrate may be damaged by discharge of static electric currents.

SUMMARY

An embodiment in accordance with the present disclosure of invention provides a mother substrate having electrostatic discharge (ESD) circuitry provided thereon for prevent static electricity from being applied in a damaging way to one or more image display areas of the mother substrate during the manufacturing process and for afterwards preventing current leakages between adjacent lines during normal post-production operation of the display panel.

A manufacturing method of a mother substrate for a display panel is also provided.

In an exemplary embodiment, a mother substrate for a liquid crystal display panel includes a base substrate, a plurality of antistatic circuits and a plurality of switching circuits. The base substrate comprises a post-production available area that remains available after production and a post-production non-available area. The available area includes a display area that displays an image in response to driving signals input through a plurality of driving signal lines during normal post-production operation. The non-available area is adjacent to and in one embodiment, surrounds the available area. The antistatic circuits are provided on the base substrate and connected with the driving signal lines, respectively. The switching circuits are interposed between adjacent antistatic circuits of the antistatic circuits. Each switching circuit electrically interconnects the adjacent antistatic circuits to each other when static electricity of an above-threshold voltage level appears during an inspection of the available area. The inspection is performed by applying one or more test signals (e.g., having voltages either above or below the predefined threshold voltage) to the driving signal lines.

In an exemplary embodiment, a method of manufacturing a mother substrate for a liquid crystal panel is provided as follows.

First, a base substrate having a plurality of driving signal lines is provided. Next, a cutting line, which defines an available area displaying an image on the base substrate and a non-available area surrounding the available area, is formed. Then, a plurality of antistatic circuits connected with the driving signal lines are formed on the available area. A plurality of switching circuits, which control electrical connection of adjacent antistatic circuits to one another are formed on the available area. Thereafter, a first signal line, which applies a test signal to the driving signal lines, is formed on the non-available area. Then, a second signal line, which applies off voltage to the switching circuits, is formed on the available area.

According to the above, static electricity applied through a driving signal line during a manufacturing process of the mother substrate is discharged to adjacent driving signal lines through switching circuits that electrically connect the plurality of antistatic circuits with adjacent antistatic circuits, so that the static electricity can be prevented from being applied in a damaging way to a display area of the mother substrate.

After a display substrate is completed and cut away from the remainder of the mother substrate, the switching circuits are controllable to electrically isolate the adjacent antistatic circuits from one another so that the characteristics of a driving signal can be prevented from being degraded by the antistatic circuits during a normal operation of the display substrate.

BRIEF DESCRIPTION OF THE DRAWINGS

The above and other advantages of the present disclosure of invention will become readily apparent by reference to the following detailed description when considered in conjunction with the accompanying drawings wherein.

DETAILED DESCRIPTION

Hereinafter, a first embodiment will be described with reference to the accompanying drawings.

Figure 1:
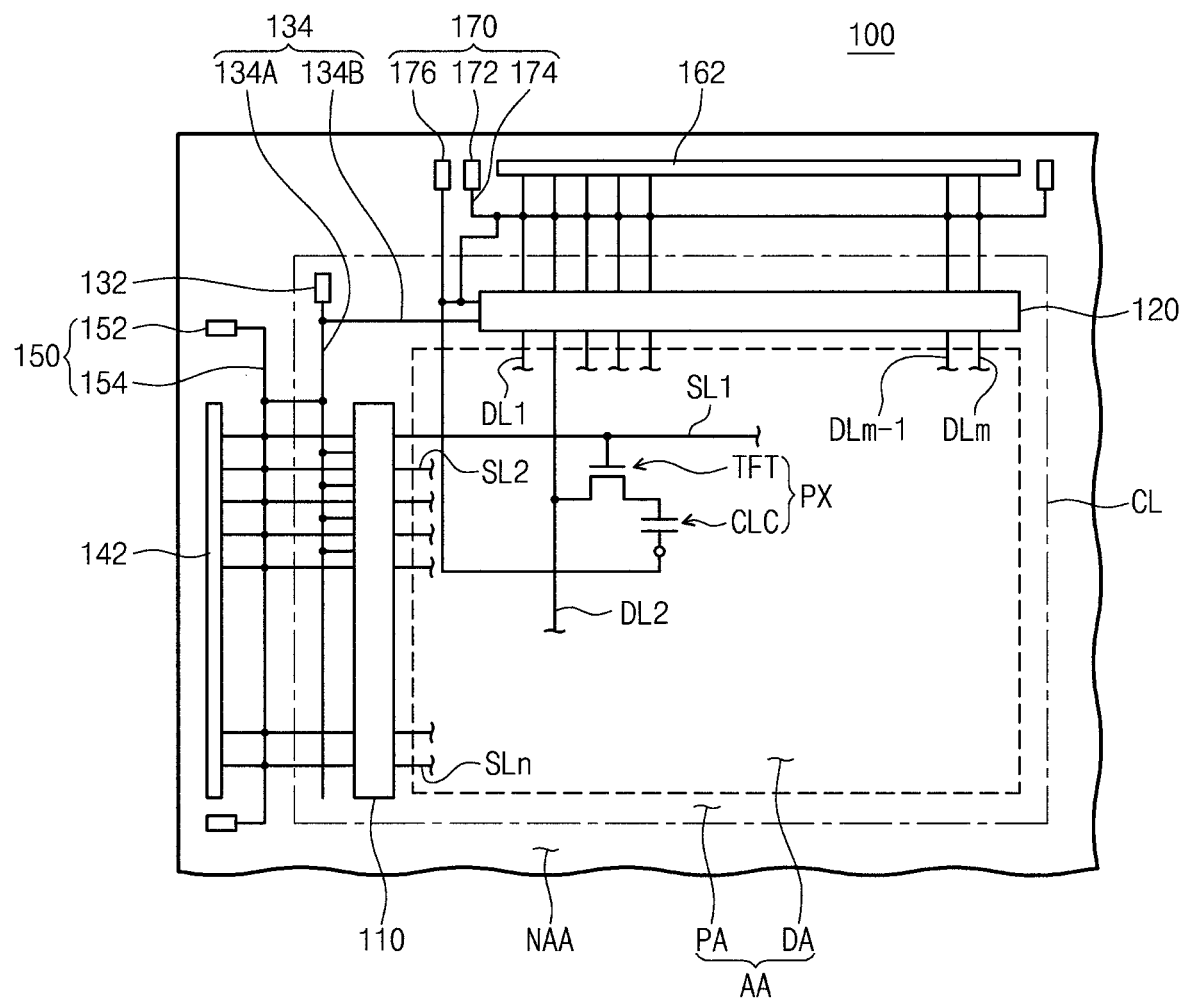
FIG. 1 is a plan view illustrating an exemplary embodiment of a mother substrate for a liquid crystal panel according to the present disclosure.

FIG. 1 is a plan view illustrating an exemplary embodiment of a mother substrate for a liquid crystal panel according to the present display.

Referring to FIG. 1, a mother substrate 100 is subdivided into a post-production available area AA and a post-production non-available area NAA by a predefined cutting line CL that defines where the mother substrate 100 will be cut to produce the corresponding liquid crystal panel. FIG. 1 shows only one post-production available area AA being present on the mother substrate 100 as an example. However, in the same or an alternate embodiment a plurality of post-production available areas may be substantially defined on as same monolithic mother substrate 100 like by separate or overlapping cutting lines CL like. After the manufacturing process of the mother substrate 100 is completed, a cutting process of cutting the mother substrate 100 along the one or more cutting line(s) CL is performed. Next, a display substrate corresponding to the post-production available area AA is separated from the mother substrate 100. Then, the display substrate is employed for a liquid crystal display panel through various post-treatment processes.

The post-production available area AA of the mother substrate 100 includes a display area DA for displaying an image and a peripheral area PA surrounding the display area DA.

The display area DA of the mother substrate 100 includes a plurality of data lines DL structured for receiving corresponding data signals (e.g., analog voltages) and a plurality of scan lines SL structured for receiving corresponding scan signals (e.g., digital row select pulses). The scan lines SL cross substantially orthogonally with the data lines such that the scan lines SL are electrically insulated from the data lines DL. A plurality of pixel units PXij each of which is electrically connected with a corresponding data line DLi and with a corresponding scan line SLj are provided in matrix format in the display area DA. Each pixel unit PX includes a respective thin film transistor TFT, which is electrically connected with a corresponding data line (e.g., DL1) and a corresponding scan line (e.g., SL1), and also with a respective liquid crystal capacitor CLC. The liquid crystal capacitor CLC receives charge defined by a data signal supplied through the thin film transistor TFT when the TFT performs a data sampling operation in response to an active scan signal on the corresponding scan line (e.g., SL1). Although not shown in FIG. 1, each pixel unit PX may further include a storage capacitor connected to the liquid crystal capacitor CLC for supplementing the effective charge storage capacity of the liquid crystal capacitor CLC.

The peripheral area PA of the mother substrate 100 includes a scan-side antistatic unit 110, a data-side antistatic unit 120, an off voltage pad 132 and a set of off voltage lines 134. The scan-side antistatic unit 110 and the data-side antistatic unit 120 can operate to prevent high voltage static electricity from being applied to the display area DA of the mother substrate 100 during the mass production processing of the mother substrate 100. In terms of more detail, the scan-side antistatic unit 110 is electrically connected with the scan lines SL, which extend into the peripheral area PA from the display area DA. The scan-side antistatic unit 110 operates to prevent the static electricity from being applied to the display area DA through the scan lines SL during manufacture. The data-side antistatic unit 120 is electrically connected with the data lines DL, which extend into the peripheral area PA from the display area DA. The data-side antistatic unit 120 operates to prevent the static electricity from being applied to the display area DA through the data lines DL during manufacture. The internal configurations and operations of the scan-side antistatic unit 110 and the data-side antistatic unit 120 will be described in detail later below.

The off voltage pad 132 is provided for receiving a turn-off control voltage (Voff) after the display substrate is separated from the mother substrate 100 through the cutting process along the CL line. The off voltage pad 132 serves as a dummy pad to which no active voltage supply is connected before the display substrate is separated from the mother substrate 100.

The off voltage lines 134 includes a first off voltage line 134A and a second off voltage line 134B, and these are electrically connected with a scan inspection line 154 described later. In detail, the first off voltage line 134A electrically connects the off voltage pad 132 with the scan-side antistatic unit 110. The second off voltage line 134B electrically connects the off voltage pad 132 with the data-side antistatic unit 120. Thus, the scan-side antistatic unit 110 and the data-side antistatic unit 120 can receive the off voltage after the display substrate is separated from the mother substrate 100.

The post-production non-available area NAA of the mother substrate 100 includes first and second shorting bars 142 and 162, a scan inspection unit 150 and a data inspection unit 170.

The first shorting bar 142 allows one end portion of each scan line, which extends to the non-available area NAA from the available area AA, to be commonly short-circuited, so that static electric charge applied through a scan pad 152 described later and/or through the scan inspection line 154 can be divided along multiple conductors and thus safely dissipated. When charge is distributed among multiple lines, its voltage tends to become reduced (V=Q/C). Thus, static electricity having a voltage level lower than that of initial static electricity is applied to each scan line by action of the first shorting bar 142. Consequently, burn out (disconnection) of the scan lines SL or breakage of the pixel units PX due to an inrush of static electricity current may be prevented.

The second shorting bar 162 allows one end portion of each data line, which extends to the non-available area NAA from the available area AA, to be commonly short-circuited, so that external static electricity can be prevented from being directly applied to the data lines in the display area DA.

The scan inspection unit 150 includes the scan pad 152 and the scan inspection line 154. The scan pad 152 receives a scan test signal from an external test apparatus (not shown). The scan inspection line 154 electrically interconnects the scan pad 152 with the scan lines SL extending to the non-available area NAA from the available area AA. Further, one end portion of the scan inspection line 154 is electrically connected with one end portion of the off voltage lines 134, so that the scan lines SL receive the scan test signal. The scan test signal is applied to the scan lines SL, so that the test apparatus can inspect a line state of the scan lines and an operation state of the switching devices TFT connected with the scan lines SL. For example, the scan test signal is applied at a voltage level higher than the threshold voltage of the switching devices TFT to turn on the switching devices TFT. In the present exemplary embodiment, the scan inspection line 154 is electrically connected with the off voltage line 134, so that the off voltage line 134 also receives the scan test signal. After the cutting process of the mother substrate 100 is completed, the scan inspection line 154 is electrically isolated from the off voltage line 134.

The data inspection unit 170 includes a data pad 172, a data inspection line 174 and a common voltage pad 176.

The data pad 172 receives a data test signal from the test apparatus. The data inspection line 174 is commonly connected with the data lines DL extending to the non-available area NAA from the data pad 172 and the available area AA, so that the data test signal can be applied to the data lines DL in the display area DA. Thus, the test apparatus (not shown) may inspect a line state of the data lines DL and an operation state of the switching devices TFT connected with the data lines DL.

The common voltage pad 176 applies a common voltage to a common electrode of the liquid crystal capacitor CLC in the available area AA.

Figure 2:
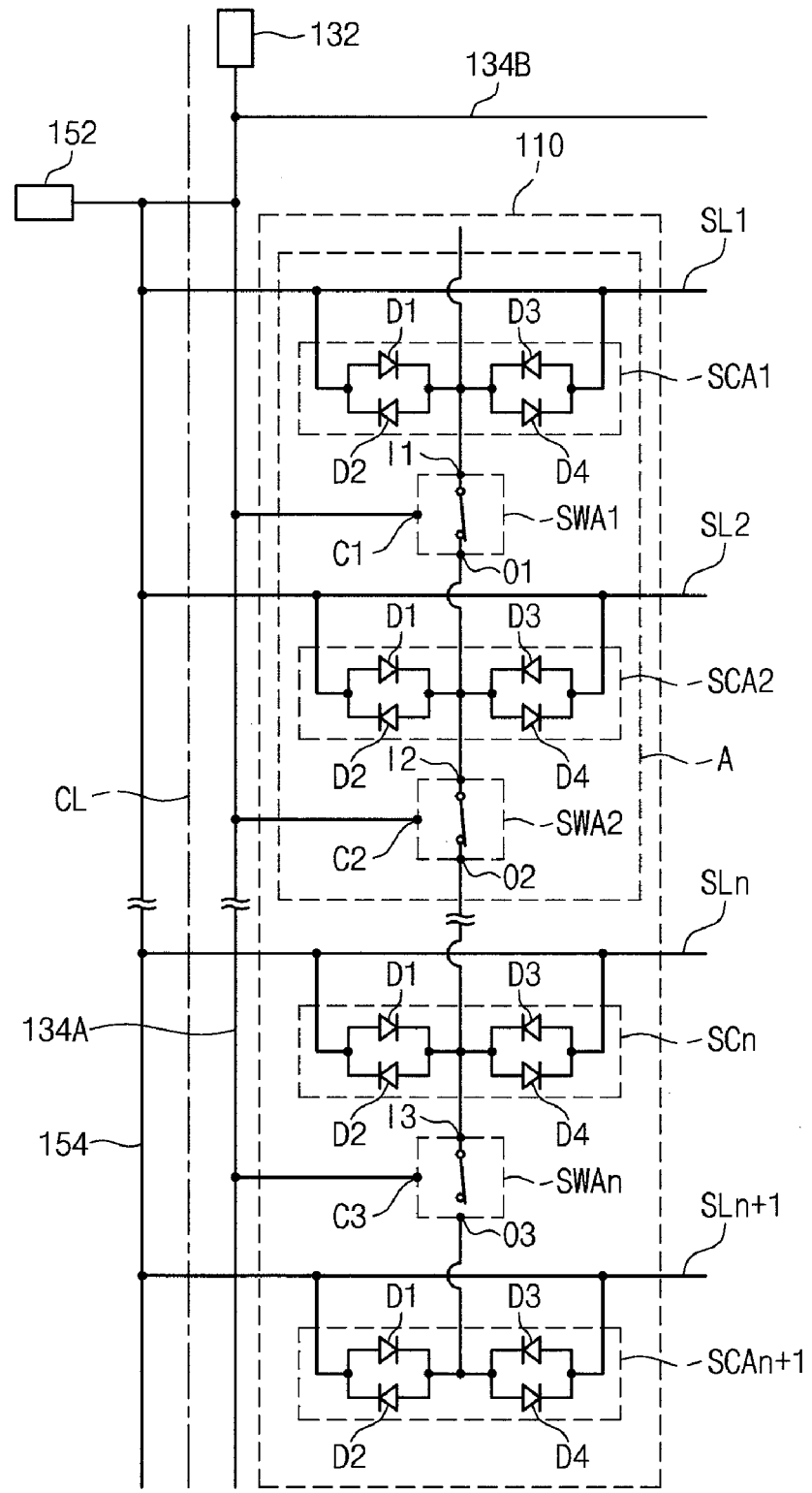
FIG. 2 is a circuit diagram illustrating the configuration of the scan-side antistatic unit shown in FIG. 1.
Figure 3:
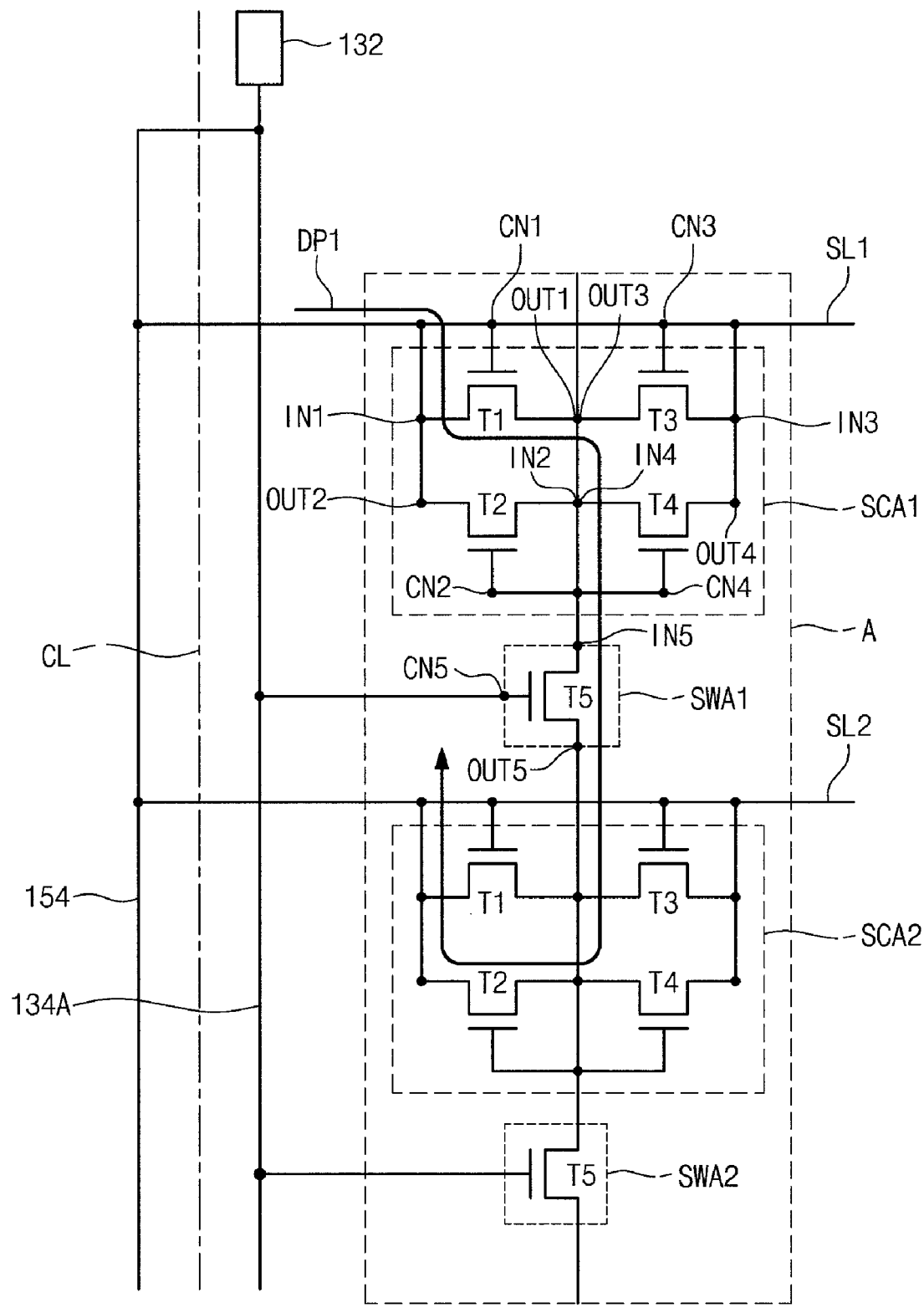
FIG. 3 is a circuit diagram illustrating a part A shown in FIG. 2.

FIG. 2 is a circuit diagram illustrating the configuration of the scan-side antistatic unit shown in FIG. 1 and FIG. 3 is a circuit diagram illustrating a part A shown in FIG. 2.

Referring to FIG. 2, the scan-side antistatic unit 110 includes a plurality of first antistatic circuits, SCA1 to SCAn+1 that are connected with the scan lines SL1 to SLn+1, respectively, and a plurality of first switching circuits SWA1 to SWAn−1 interposed between the first antistatic circuits that are adjacent to each other of the first antistatic circuits SCA1 to SCAn+1, respectively. The first antistatic circuits SCA1 to SCAn+1 each have the same configuration and function. In order to avoid redundancy of description about the first antistatic circuits SCA2 to SCAn+1 which are connected with the second to $n^{th}$ scan lines SL2 to SLn, respectively, only a description about the first antistatic circuit SCA1 (hereinafter, referred to as present-stage antistatic circuit) connected with the first scan line SL1 will be provided. Since the first switching circuits SWA1 to SWAn have the same configuration and function, only the switching circuit SWA1 (hereinafter, referred to as present-stage switching circuit) interposed between the first scan line SL1 (hereinafter, referred to as present-stage scan line) and the second scan line SL2 (hereinafter, referred to as next-stage scan line) will be described, and a description about the remaining switching circuits SWA1 to SWAn will be omitted.

The present-stage antistatic circuit SCA1 includes first and second diode circuits. The first diode circuit includes first and second opposingly facing diodes D1 and D2 connected in parallel to each other. The first diode D1 is connected with the present-stage scan line SL1 in a forward direction and the second diode D2 is connected with the present-stage scan line SL1 in a backward direction. The second diode circuit includes third and fourth opposingly facing diodes D3 and D4 connected in parallel to each other. The third diode D3 is connected with the present-stage scan line SL1 in a backward direction and the fourth diode D4 is connected with the present-stage scan line SL1 in a forward direction. In one embodiment, diodes D1-D4 are implemented by diode-connected MOSFETs (see FIG. 3).

The present-stage switching circuit SWA1 controls electrical connection between the present-stage antistatic circuit SCA1 and the next-stage antistatic circuit SCA2.

Hereinafter, an example of a detailed configuration of the present-stage antistatic circuit SCA1 and the present-stage switching circuit SWA1 will be described.

Referring to FIG. 3, the present-stage antistatic circuit SCA1 includes first to fourth NMOS transistors T1 to T4.

The first transistor T1 includes a first input terminal IN1 connected with the first scan line SL1, a first control terminal CN1 connected with the first input terminal IN1, a first output terminal OUT1 connected with an input terminal IN5 of a fifth transistor T5. Thus, the first transistor T1 implements the first diode D1 shown in FIG. 2.

The second transistor T2 includes a second input terminal IN2 electrically connected with the input terminal IN5 of the fifth transistor T5, a second control terminal CN2 connected with the second input terminal IN2, and a second output terminal OUT2 connected with the first input terminal IN1. Thus, the second transistor T2 constitutes the second diode D2 shown in FIG. 2.

The third transistor T3 includes a third input terminal IN3 connected with the present-stage scan line SL1, a third control terminal CN3 connected with the third input terminal IN3, and a third output terminal OUT3 connected with the input terminal IN5 of the fifth transistor T5. Thus, the third transistor T3 constitutes the third diode D3 shown in FIG. 2.

The fourth transistor T4 includes a fourth input terminal IN4 connected with the input terminal IN5 of the fifth transistor T5, a fourth control terminal CN4 connected with the fourth input terminal IN4, and a fourth output terminal OUT4 connected with the third input terminal IN3. Thus, the fourth transistor T4 constitutes the fourth diode D4 shown in FIG. 2.

The present-stage switching circuit SWA1 includes the fifth transistor T5.

The fifth transistor T5 includes the input terminal IN5, a fifth control terminal CN5 connected with the first off voltage line 134A, and an output terminal connected with a first transistor provided in the next-stage switching circuit SWA2. Thus, the fifth transistor T5 controls electrical connection between the present-stage antistatic circuit SCA1 and the next-stage antistatic circuit SCA2. As shown in FIG. 3, the scan inspection line 154 is electrically connected with the present-stage scan line SL1. The scan inspection line 154 is also electrically connected with the gate of transistor T5 through line 134A. Thus, if high voltage static electricity is applied to the present-stage scan line SL1 through the scan inspection line 154, the fifth transistor T5 is turned on in response to the static electricity (which is above T5's threshold voltage) to electrically connect the present-stage antistatic circuit SCA1 with the next-stage antistatic circuit SCA2.

If the high voltage static electricity having a voltage level higher than that of threshold voltage of the first to fourth transistors T1 to T4 is applied to the present-stage scan line SL1 through the scan inspection line 154 shown in FIG. 3, the first transistor T1 is also turned on. Since the first off voltage line 134A is electrically connected with the scan inspection line 154, the fifth transistor T5 is turned on as mentioned above. Thus, the high voltage static electricity applied to the present-stage scan line SL1 is discharged to the next-stage scan line SL2 through a discharge path DP1 including the first transistor T1, the fifth transistor T5, and a second transistor T2 of the next-stage antistatic circuit SCA2. Further, the high voltage static electricity may be discharged to the next-stage scan line SL2 through a path (not shown) including the third transistor T3, the fifth transistor T5, and a fourth transistor T4 of the next-stage antistatic circuit SCA2.

While the static electricity is being discharged to the next-stage scan line SL2, the present-stage antistatic circuit SCA1 and the next-stage antistatic circuit SCA2 reduce the voltage level of the static electricity. In detail, the static electric charge applied to the present-stage scan line SL1 via inspection line 154 is absorbed while being dissipated and discharged by its flow to the next-stage scan line SL2 along discharge path DP1 for example.

If the static electricity applied to the present-stage scan line SL1 is not sufficiently removed (e.g., decreased in voltage level) while being discharged to the next-stage scan line SL2, remaining static electricity is discharged to a further next-stage scan line SL3 via an antistatic circuit SCA3 connected with the further next-stage scan line SL3. Thus, the remaining static electricity may be completely removed.

As a result, the scan-side antistatic unit 110 distributes the static electricity, which is applied to the corresponding scan line SL1, to the other scan lines, thereby preventing an inrush of current from high voltage static electricity from being applied to the post-production available area AA.

Meanwhile, the last-stage scan line SLn+1 of the scan lines SL1 to SLn+1 serves as a dummy line that discharges static electricity applied to an n-th scan line SLn.

As described above, if the manufacturing and pre-cut testing processes of the mother substrate 100 are completed, the cutting process of the cutting the mother substrate along the cutting line CL shown in FIG. 1 is performed, so that one or more display panel substrates are produced from the mother substrate 100 and these are employed for various display apparatuses. The scan-side antistatic circuits SCA1 to SCAn+1 of the display substrate employed for the display apparatus may degrade the characteristics of driving signals applied to a corresponding scan line when the display apparatus normally operates. In detail, when the driving signals applied to the scan lines SL1 to SLn+1 and the display apparatus normally operates, since the driving signal applied to the present-stage scan line SL1 is transferred to the next-stage scan line SL2 through the present-stage switching circuit SWA1, the characteristics of the driving signal applied to the present-stage scan line SL1 may be degraded if T5 is allowed to remain conductive.

In order to solve such a problem, the fifth transistor T5 provided in each switching circuit is turned off if the display substrate produced from the mother substrate 100 shown in FIG. 1 is employed for the display apparatus, thereby electrically isolating the antistatic circuits that were dependently connected with one another during the pre-cut phase.

Particularly, if the manufacturing process of the mother substrate 100 shown in FIG. 1 is completed, the mother substrate 100 is cut along the cutting line CL. Through this cutting process, the scan inspection line 154 (see FIG. 1) provided in the post-production non-available area NAA is electrically isolated from the first off voltage line 134A provided in the post-production available area AA. Then, a gate driving circuit (not shown) is electrically connected with one end portion of the display substrate facing the display area DA while leaving the scan-side antistatic unit 110 interposed therebetween. That is, the gate driving circuit is electrically connected with the scan lines SL1 to SLn+1. Further, the gate driving circuit can be electrically connected with one end portion (e.g., edge) of the display substrate through one of a tape carrier package (TCP) scheme, an amorphous silicon gate (ASG) scheme and a chip on glass (COG) scheme. When the display substrate normally operates, the gate driving circuit outputs a scan driving signal to the scan lines SL1 to SLn+1 in response to gate driving voltage provided from an external apparatus (not shown). The gate driving voltage includes a gate-on voltage used to turn on and a gate-off voltage used to turn off the thin film transistor TFT shown in FIG. 1. Further, when the display substrate normally operates, the off voltage pad 132 receives the off voltage (Voff) from the external apparatus. The off voltage may be substantially equal to the gate off voltage. The fifth transistor T5 provided in each switching circuit receives the off voltage through the first off voltage line 134A connected with the off voltage pad 132, and is turned off in response to the off voltage. Thus, when the display substrate normally operates, the antistatic circuits dependently connected with other are electrically isolated from each other. Consequently, when the display substrate normally operates, the scan driving signal applied to a corresponding scan line is prevented from being applied to an adjacent scan line, so that the characteristics of the scan driving signal applied to the corresponding scan line may be prevented from being degraded.

As a result, during the manufacturing process of the mother substrate 100, the switching circuits SWA1 to SWAn provide current discharge and dissipation paths for static electricity applied to the scan lines via the inspection line 154, thereby preventing the static electricity from being applied in a damaging way to the display area. Further, when the display substrate produced from the mother substrate 100 normally operates, the switching circuits SWA1 to SWAn can be driven to be substantially nonconductive to thereby electrically isolate the antistatic circuits from each other. Thus, the characteristics of the scan driving signal applied to the corresponding scan line may be prevented from being degraded due to the antistatic circuits.

Figure 4:
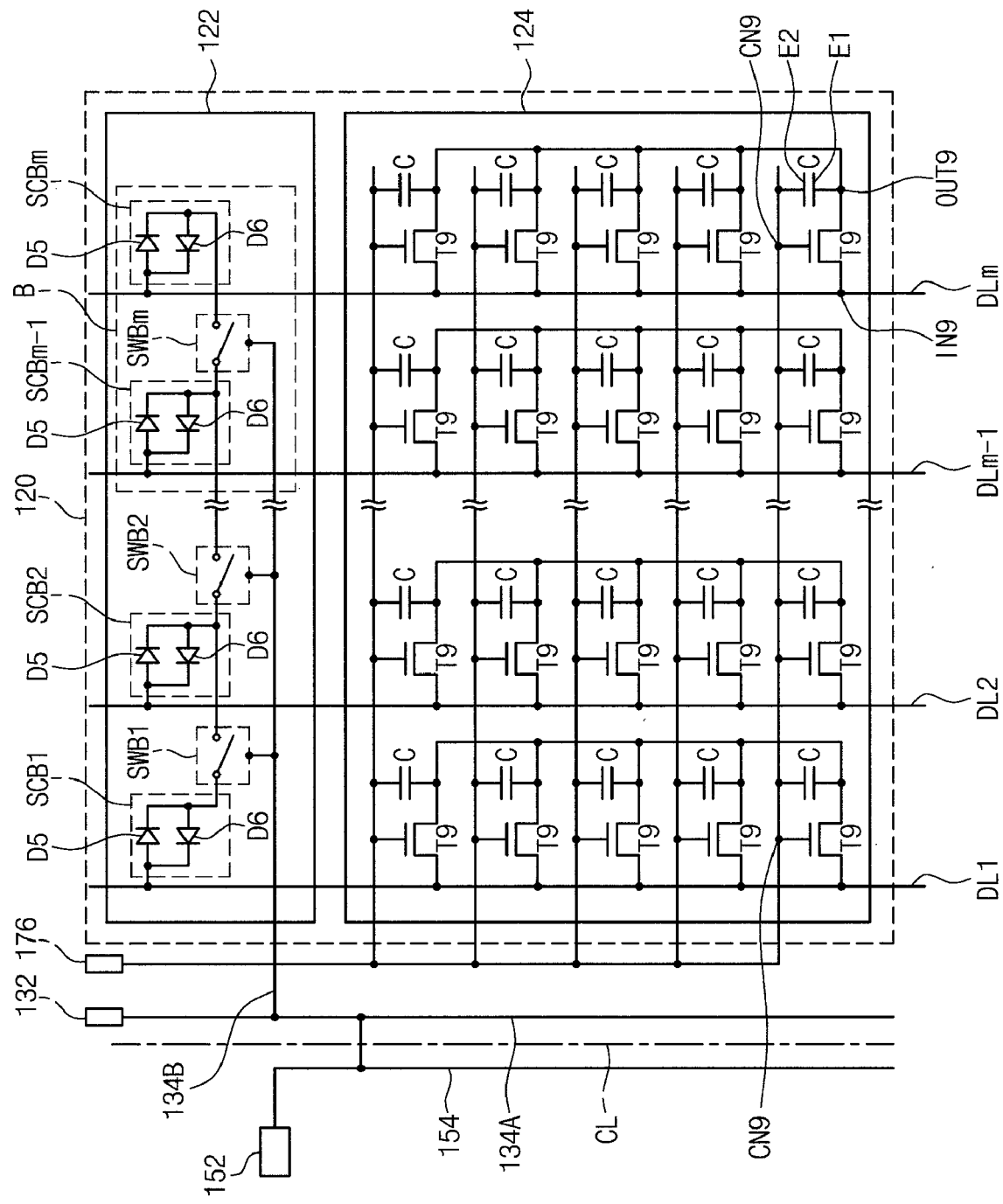
FIG. 4 is a circuit diagram illustrating the configuration of the data-side antistatic unit shown in FIG. 1.
Figure 5:
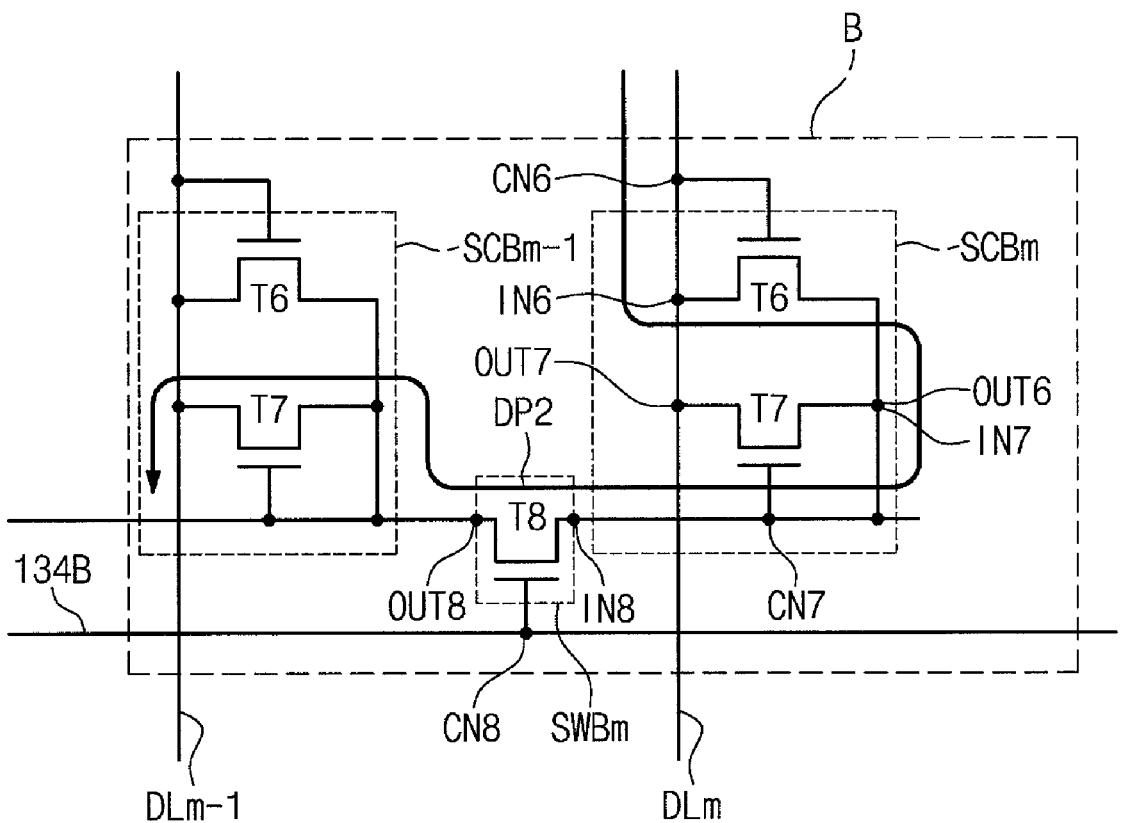
FIG. 5 is a detailed circuit diagram illustrating a part B shown in FIG. 4.

FIG. 4 is a circuit diagram illustrating the configuration of the data-side antistatic unit shown in FIG. 1 and FIG. 5 is a circuit diagram illustrating a part B shown in FIG. 4.

Referring to FIG. 4, the data-side antistatic unit 120 includes first and second antistatic sections 122 and 124. The first antistatic section 122 primarily prevents static electricity, which is applied to data lines DL1 to DLm through the data inspection line 174 shown in FIG. 1, from being applied to the post-production available area AA. The second antistatic section 124 secondarily prevents remaining static electricity, which is not fully dissipated by the first antistatic section 122, from being applied to the post-production display area DA (not shown in FIG. 4 but understood to be below the second antistatic section 124).

In detail, the first antistatic section 122 includes a plurality of antistatic circuits SCB1 to SCBm, which are connected with the data lines DL1 to DLm, respectively, and a plurality of switching circuits SWB1 to SWBm−1 interposed between the second antistatic circuits 124, which are adjacent to each other, of the antistatic circuits SCB1 to SCBm, respectively. In the present exemplary embodiment, since the antistatic circuits SCB1 to SCBm have the same configuration and function, only the m-th antistatic circuit SCBm (hereinafter, referred to as present-stage antistatic circuit) will be described in order to avoid redundancy. Further, since the switching circuits SWB1 to SWBm−1 have the same configuration and function, only the m-th switching circuit SWBm (hereinafter, referred to as present-stage switching circuit) will be described in order to avoid redundancy.

The present-stage antistatic circuit SCBm includes a third diode circuit having fifth and sixth diodes D5 and D6 connected to each other as shown. Since the third diode circuit has the same configuration and function as those of the first diode circuit provided in the scan-side antistatic unit 110, a detailed description thereof will be omitted.

Referring to FIG. 5, the present-stage antistatic circuit SCBm includes sixth and seventh transistors T6 and T7.

The sixth transistor T6 includes an input terminal IN6 connected with the m-th data line DLm (hereinafter, referred to as present-stage data line), a control terminal CN6 connected with the input terminal IN6, and an output terminal OUT6 connected with an input terminal IN7 of the seventh transistor T7. Thus, the diode-connected sixth transistor T6 implements the fifth diode D5 shown in FIG. 4.

The seventh transistor T7 includes an input terminal IN7, a control terminal CN7 connected with the input terminal IN7, and an output terminal OUT7 connected with the present-stage data line DLm. Thus, the seventh transistor T7 constitutes the sixth diode D6 shown in FIG. 4.

The present-stage switching circuit SWBm includes an eighth transistor T8. The eighth transistor T8 includes an input terminal IN8 connected with the output terminal OUT6 of the sixth transistor T6, a control terminal CN8 electrically connected with the second off voltage line 134B, and an output terminal OUT8 connected with the input terminal IN7 of the seventh transistor T7 provided in the (m−1)th antistatic circuit SCBm−1 (hereinafter, referred to as previous-stage antistatic circuit).

If high voltage static electricity, which has a voltage level higher than that of threshold voltages of the sixth transistors T6 and the seventh transistor T7 provided in the previous-stage antistatic circuit SCBm−1, is applied to the present-stage data line DLm through the data inspection line 174 shown in FIG. 1, the sixth transistor T6 and the seventh transistor T7 are turned on, respectively. In the present exemplary embodiment, since the second off voltage line 134B is electrically connected with the data inspection line 174, the eighth transistor T8 provided in the present-stage switching circuit SWBm is also turned on. Thus, the high voltage static electricity applied to the present-stage data line DLm is discharged to the previous-stage data line DLm−1 through a path DP2 including the sixth transistor T6 of the present-stage antistatic circuit SCBm, the eighth transistor T8, and the seventh transistor T7 of the previous-stage antistatic circuit SCBm−1. While the static electricity is being discharged to the previous-stage data line DLm−1, the present-stage antistatic circuit SCBm and the previous-stage antistatic circuit SCBm−1 reduce the voltage level of the lines receiving the inrush of static electricity current. That is, the static electricity applied to the present-stage data line DLm may be dissipated by being discharged into the previous-stage data line DLm−1.

If the static electricity applied to the present-stage data line DLm is not sufficiently absorbed due to being discharged to the previous-stage data line DLm−1, remaining static electricity is safely absorbed by being discharged into a further previous-stage data line DLm−2 via the antistatic circuit SCBm−1 connected with the further previous-stage data line DLm−2. Thus, the remaining static electricity is completely removed.

As a result, similarly to the scan-side antistatic unit 110, the data-side antistatic unit 120 distributes the static electricity, which is applied to the corresponding data line, to the other data lines, thereby primarily preventing the high voltage static electricity from being applied to the available area AA. Meanwhile, the first-stage data line DL1 of the data lines DL1 to DLm serves as a dummy line that discharges static electricity applied to a second-stage data line DL2.

As described for the scan-side antistatic unit 110, if the manufacturing process of the mother substrate 100 is completed, the mother substrate 100 is cut along the cutting line CL. The data inspection line 174 (see FIG. 1) provided in the post-production non-available area NAA is electrically isolated from the second off voltage line 134B provided in the available area AA. Then, a data driving circuit (not shown) is electrically connected with one end portion of the display substrate facing the display area DA while interposing the data-side antistatic unit 120 therebetween. The data driving circuit may be electrically connected with the display substrate through one of the TCP scheme, the ASG scheme and the COG scheme. When the display substrate normally operates, the eighth transistor T8 provided in each switching circuit receives the off voltage through the second off voltage line 134B connected with the off voltage pad 132, and is turned off in response to the off voltage. Thus, when the display substrate normally operates, the antistatic circuits dependently connected with other are electrically isolated from each other. Consequently, when the display substrate normally operates, the data driving signal applied to a corresponding data line is prevented from being applied to an adjacent data line, so that the characteristics of the data driving signal applied to the corresponding data line may be prevented from being degraded.

As a result, during the manufacturing process of the mother substrate 100, the switching circuits SWB1 to SWBm provide a discharge path of static electricity applied to the data line, thereby preventing the static electricity from being applied to the display area. Further, when the display substrate normally operates, the switching circuits SWB1 to SWBm electrically isolate the antistatic circuits from each other. Thus, the characteristics of the data driving signal applied to the corresponding data line may be prevented from being degraded due to the antistatic circuits.

Referring again to FIG. 4, the second antistatic section 124 provides additional charge absorption capacity for receiving charge of the remaining static electricity that is not fully dissipated by the first antistatic section 122.

More particularly, the second antistatic section 124 includes a plurality of ninth transistors T9 connected in parallel to the data lines DL1 to DLm, and a plurality of capacitors C electrically connected with one end of each transistor T9. For example, FIG. 4 shows five ninth transistors T9 and five capacitors C in each data line.

Each of the ninth transistors T9 includes an input terminal IN9 electrically connected with a corresponding data line, a control terminal CN9 electrically connected with the common voltage pad 176 shown in FIG. 1, and an output terminal OUT9 electrically connected with a first electrode E1 of each capacitor C. Each capacitor C includes the first electrode E1, and a second electrode E2 electrically connected with the control terminal CN9 of the ninth transistor T9.

If the remaining static electricity being not discharged by the first antistatic section 122 is applied to the second antistatic section 124, the remaining static electricity is charged (dissipated) to the capacitors C. If the remaining static electricity charged to the capacitors C exceeds charge capacities of the capacitors C, an active semiconductive film of the ninth transistors T9 is destroyed. Thus, the remaining static electricity is removed as heat dissipated through the sacrificially destroyed ninth transistors T9.

As a result, the high voltage static electricity applied to the data lines is primarily discharged by the first antistatic section 122, and is secondarily absorbed by the second antistatic section 124. Consequently, the high voltage static electricity may be prevented from being completely applied to the display area.

Meanwhile, the transistors T1 to T9 provided in the scan-side antistatic unit 110 and the data-side antistatic unit 120 are fabricated through a thin semiconductor film forming process similarly to that used for the thin film transistors (TFTs) provided in the display area DA. Thus, the transistors T1 to T9 are turned on at a threshold voltage level similar to that of threshold voltage used to turn on the thin film transistor TFT provided in the display area DA, so that the scan-side antistatic unit 110 and the data-side antistatic unit 120 may be stably driven on an amorphous silicon substrate. In an alternate embodiment, transistors T1 to T9 provided in the scan-side antistatic unit 110 and the data-side antistatic unit 120 may be doped during production to have higher threshold voltages than those of the display area TFTs.

Accordingly, a mother substrate is provided for the liquid crystal display panel and the manufacturing method therefor where static electricity applied through the inspection lines during the manufacturing process of the mother substrate can be safely discharged or dissipated to adjacent signal lines through the switching circuits that electrically connect the antistatic circuits with adjacent antistatic circuits, so that the static electricity may be prevented from being applied in a damaging way to the display area of the mother substrate.

After the display substrate is completed separated from the mother substrate, the switching circuits are place in nonconductive modes so as to electrically isolate the adjacent antistatic circuits from one another, so that the characteristics of the normal operational driving signals may be prevented from being substantially degraded by the presence of the antistatic circuits during the normal operation of the display substrate.

Although exemplary embodiments have been described herein, it is understood that the present disclosure of invention should not be limited to these exemplary embodiments and that various changes and modifications can be made by one ordinary skilled in the art in view of, and within the spirit and scope of the present disclosure as here provided.

What is claimed is:

1. A mother substrate used for production of an included liquid crystal display panel, the mother substrate comprising:
    a base substrate comprising a post-production available area, which will display an image in response to driving signals input through a plurality of driving signal lines, and comprising a post-production non-available area adjacent to the post-production available area;
    a plurality of antistatic circuits provided adjacent to each other on the base substrate and connected with the driving signal lines, respectively; and
    a plurality of switching circuits interposed between adjacent antistatic circuits of the antistatic circuits, respectively,
    wherein each switching circuit among the switching circuits is operable to electrically interconnect adjacent ones of the antistatic circuits to each other when an inspection of the post-production available area is performed by applying one or more test signals to the driving signal lines, and electrically isolate the adjacent ones of the antistatic circuits from one another when a normal operation of the post-production available area is performed by applying the driving signals to the driving signal lines.

2. The mother substrate of claim 1, wherein each switching circuit among the switching circuits electrically interconnects with an adjacent antistatic circuit in response to application of static electricity voltage greater than a predetermined threshold voltage, and electrically isolates at least two adjacent antistatic circuits in response to a turn-off voltage.

3. The mother substrate of claim 2, wherein each antistatic circuit among the antistatic circuits discharges the static electricity, which is applied to a corresponding driving signal line of the driving signal lines, to a driving signal line adjacent to the corresponding driving signal line.

4. The mother substrate of claim 1, wherein the driving signal lines comprise a plurality of scan lines and a plurality of data lines, and
    wherein the base substrate comprises:
    a plurality of thin film transistors electrically connected with the scan lines and the data lines, respectively; and
    a plurality of liquid crystal capacitor units electrically connected with the scan lines and the data lines by the thin film transistors.

5. The mother substrate of claim 4, wherein an antistatic circuit among the antistatic circuits comprises:

a first transistor comprising a first input terminal connected with a scan line among the scan lines, a first control terminal connected with the first input terminal, and a first output terminal connected with a switching circuit among the switching circuits;
    a second transistor comprising a second input terminal connected with the switching circuit, a second control terminal connected with the second input terminal, and a second output terminal connected with the first input terminal;
    a third transistor comprising a third input terminal connected with the scan line that is connected with the first input terminal, a third control terminal connected with the third input terminal, and a third output terminal connected with the switching circuit that is connected with the first output terminal; and
    a fourth transistor comprising a fourth input terminal connected with the switching circuit that is connected with the first output terminal, a fourth control terminal connected with the fourth input terminal, and a fourth output terminal connected with the third input terminal.

6. The mother substrate of claim 5, wherein the switching circuit that is connected with the first output terminal comprises a fifth transistor comprising a fifth input terminal, a fifth control terminal connected with a switching signal line that transmits a switching signal to the switching circuit, and a fifth output terminal connected with an antistatic circuit that is connected with another scan line, which is adjacent to the scan line that is connected with the first input terminal.

7. The mother substrate of claim 6, wherein the fifth transistor is turned on in response to static electricity having a voltage greater than a predefined threshold voltage appearing during inspection of the post-production available area.

8. The mother substrate of claim 7, wherein the static electricity applied to the scan line that is connected to the first input terminal is discharged to the scan line that is connected with the antistatic circuit connected with the fifth output terminal through a discharge path comprising at least one transistor provided in the antistatic circuit that is connected with the fifth output terminal.

9. The mother substrate of claim 7, wherein the fifth transistor is turned off in response to application of a turn-off control voltage to thereby open the discharge path.

10. The mother substrate of claim 9, wherein the turn-off voltage turns off the thin film transistors.

11. The mother substrate of claim 4, wherein an antistatic circuit among the antistatic circuits comprises:
    a first transistor comprising a first input terminal connected with a data line among the data lines, a first control terminal connected with the first input terminal, and a first output terminal connected with a switching circuit among the switching circuits; and
    a second transistor comprising a second input terminal connected with the first output terminal, a second control terminal connected with the second input terminal, and a second output terminal connected with the data line that is connected with the first input terminal.

12. The mother substrate of claim 11, wherein the switching circuit that is connected with the first output terminal comprises a third transistor comprising a third input terminal connected with the first output terminal, a third control terminal connected with a switching signal line, and a third output terminal connected with an antistatic circuit that is connected with another data line.

13. The mother substrate of claim 12, wherein the third transistor is turned on in response to application of static electricity exceeding a predetermined threshold voltage during inspection of the post-production available area.

14. The mother substrate of claim 13, wherein static electricity applied to the data line that is connected with the first input terminal is discharged to the data line that is connected with the antistatic circuit connected with the third output terminal through a discharge path comprising at least one transistor provided in the antistatic circuit that is connected with the third output terminal.

15. The mother substrate of claim 14, wherein the third transistor opens the discharge path in response to the turn-off voltage.

16. A display panel comprising:
- a plurality of antistatic circuits provided adjacent to each other and connected with scan lines, respectively; and
- a plurality of switching circuits interposed between adjacent antistatic circuits of the antistatic circuits, respectively,
- wherein each switching circuit among the switching circuits comprises a control terminal connected with a wire provided with a turn-off voltage and, in response to the turn-off voltage, makes at least two antistatic circuits adjacent to the switching circuit electrically isolated from one another.

17. The display panel of claim 16, wherein an antistatic circuit among the antistatic circuits comprises:
- a first transistor comprising a first input terminal connected with a scan line among the scan lines, a first control terminal connected with the first input terminal, and a first output terminal connected with a switching circuit among the switching circuits;
- a second transistor comprising a second input terminal connected with the switching circuit, a second control terminal connected with the second input terminal, and a second output terminal connected with the first input terminal;
- a third transistor comprising a third input terminal connected with the scan line that is connected with the first input terminal, a third control terminal connected with the third input terminal, and a third output terminal connected with the switching circuit that is connected with the first output terminal; and
- a fourth transistor comprising a fourth input terminal connected with the switching circuit that is connected with the first output terminal, a fourth control terminal connected with the fourth input terminal, and a fourth output terminal connected with the third input terminal.

18. The display panel of claim 17, wherein the switching circuit that is connected with the first output terminal comprises a fifth transistor comprising a fifth input terminal, a fifth control terminal connected with the wire, and a fifth output terminal connected with an antistatic circuit that is connected with another scan line, which is adjacent to the scan line that is connected with the first input terminal.

* * * * *